United States Patent
Gabriel et al.

(10) Patent No.: US 6,716,571 B2
(45) Date of Patent: Apr. 6, 2004

(54) SELECTIVE PHOTORESIST HARDENING TO FACILITATE LATERAL TRIMMING

(75) Inventors: Calvin T. Gabriel, Cupertino, CA (US); Harry J. Levinson, Saratoga, CA (US); Uzodinma Okoroanyanwu, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 84 days.

(21) Appl. No.: 09/819,343

(22) Filed: Mar. 28, 2001

(65) Prior Publication Data

US 2002/0139773 A1 Oct. 3, 2002

(51) Int. Cl.$^7$ ............................. G03F 7/00; H01L 21/00
(52) U.S. Cl. ...................... 430/313; 430/296; 430/942; 438/689; 438/710; 438/725; 216/48; 216/67; 216/72
(58) Field of Search ................................ 430/313, 296, 430/942; 216/48, 67, 72; 438/689, 710, 725

(56) References Cited

U.S. PATENT DOCUMENTS

| | | | |
|---|---|---|---|
| 3,997,367 A | * 12/1976 | Yau | 438/374 |
| 4,394,211 A | * 7/1983 | Uchiyama et al. | 438/623 |
| 4,446,222 A | 5/1984 | Kress | 430/307 |
| 5,003,178 A | 3/1991 | Livesay | 250/492.3 |
| 5,242,864 A | 9/1993 | Fassberg et al. | 438/701 |
| 5,468,595 A | 11/1995 | Livesay | 430/296 |
| 5,510,216 A | 4/1996 | Calabrese et al. | 430/16 |
| 5,658,469 A | * 8/1997 | Jennison | 428/611 |
| 5,747,803 A | 5/1998 | Doong | 250/307 |
| 5,783,366 A | 7/1998 | Chen et al. | 430/311 |
| 5,876,903 A | * 3/1999 | Ng et al. | 430/313 |
| 5,928,821 A | 7/1999 | Garrity et al. | 430/23 |

(List continued on next page.)

OTHER PUBLICATIONS

Chiong K.G. et al. "Resist Contrast Enhancement in High Resolution Electron Beam Lithography", Journal of Vacuum Science and Technology: Part B, American Institute of Physics, New York, US, vol. 7, No. 6.

Patent Abstract of Japan, vol. 1999, No. 09, Jul. 30, 1999 & JP 11 097328 A (Toshiba Corp), Apr. 9, 1999 abstract.

Livesay, W. R., "*Large–area electron–beam source,*" Journal of Vacuum Science & Technology B, vol. 11, No. 6, Nov./Dec. 1993, pp. 2304–2308, American Vacuum Society.

Yang, J. J. et al, "*Electron Beam Processing for Spin–on Polymers and its Applications to Back–End–of–Line (BEOL) Integration,*" Materials Research Society Symposium Proceedings, vol. 511, 1998, pp. 49–55, Materials Research Society.

Ross et al. "*Plasma Etch Characteristics of Electron Beam Processed Photoresist,*" The Society of Photo–Optical Instrumentation Engineers, vol. 2438, 1995, pp. 803–816, SPIE–The International Society for Optical Engineering.

Grün, Von A. E., "*Lumineszenz–photometrische Messungen der Energieabsorption im Strahlungsfeld von Elektronenquellen Eindimensionaler Fall in Luft,*" Zeitschrift für Naturforschung, vol. 12a, 1957, pp. 89–95, Publisher: Zeitschrift für Naturforschung; full English Translation attached (11 pgs.).

*Primary Examiner*—Mark F. Huff
*Assistant Examiner*—Kripa Sagar
(74) *Attorney, Agent, or Firm*—Foley & Lardner

(57) ABSTRACT

A process for forming sub-lithographic features in an integrated circuit is disclosed herein. The process includes modifying a photoresist layer after patterning and development but before it is utilized to pattern the underlying layers. The modified photoresist layer has different etch rates in the vertical and horizontal directions. The modified photoresist layer is trimmed with a plasma etch. A feature included in the trimmed photoresist layer has a sub-lithographic lateral dimension.

24 Claims, 3 Drawing Sheets

U.S. PATENT DOCUMENTS

| | | | |
|---|---|---|---|
| 5,962,195 A * | 10/1999 | Yen et al. | 430/316 |
| 5,965,461 A * | 10/1999 | Yang et al. | 438/717 |
| 5,994,225 A | 11/1999 | Liu et al. | 430/313 |
| 6,103,457 A | 8/2000 | Gabriel | 430/318 |
| 6,107,172 A * | 8/2000 | Yang et al. | 438/585 |
| 6,110,837 A | 8/2000 | Linliu et al. | 438/723 |
| 6,121,130 A | 9/2000 | Chua et al. | 438/623 |
| 6,143,666 A | 11/2000 | Lin et al. | 438/725 |
| 6,174,818 B1 | 1/2001 | Tao et al. | 438/733 |
| 6,183,937 B1 * | 2/2001 | Tsai et al. | 430/313 |
| 6,197,687 B1 | 3/2001 | Buynoski | 43/671 |
| 6,200,903 B1 * | 3/2001 | Oh et al. | 438/717 |
| 6,232,048 B1 | 5/2001 | Buynoski et al. | 430/328 |
| 6,319,655 B1 | 11/2001 | Wong et al. | 430/311 |
| 6,358,670 B1 | 3/2002 | Wong et al. | 430/296 |
| 6,395,447 B1 | 5/2002 | Ishii et al. | 430/191 |
| 6,420,097 B1 | 7/2002 | Pike et al. | 430/313 |
| 6,420,702 B1 | 7/2002 | Tripsas et al. | 250/310 |
| 6,444,381 B1 | 9/2002 | Singh et al. | 430/30 |
| 6,589,709 B1 | 7/2003 | Okoroanyanwu et al. | 430/296 |
| 2003/0017711 A1 * | 1/2003 | Mahorowala et al. | 438/719 |

* cited by examiner

SELECTIVE PHOTORESIST HARDENING TO FACILITATE LATERAL TRIMMING

CROSS REFERENCE TO RELATED APPLICATIONS

The present application is related to U.S. application Ser. No. 09/819,692 by Okoroanyanwu at al., entitled "Process for Preventing Deformation of Patterned Photoresist Features by Electron Beam Stabilization;" U.S. application Ser. No. 09/820,143 by Okoroanyanwu et al., entitled "Improving SEM Inspection and Analysis of Patterned Photoresist Features;" U.S. application Ser. No. 09/819,344 by Okoroanyanwu et al., entitled "Process for Reducing the Critical Dimensions of Integrated Circuit Device Features;" U.S. application Ser. No. 09/819,342 by Shields et al., entitled "Process for Forming Sub-Lithographic Photoresist Features by Modification of the Photoresist Surface;" and U.S. application Ser. No. 09/819,652 by Gabriel et al., entitled "Process for Improving the Etch Stability of Ultra-Thin Photoresist," all filed on an even date herewith and assigned to the Assignee of the present application.

FIELD OF THE INVENTION

The present specification relates generally to integrated circuit (IC) fabrication. More particularly, the present specification relates to fabrication of IC features having sub-lithographic lateral dimensions using a preferentially hardened etch resistant photoresist surface.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, gate lengths in field-effect transistors and the width of conductive lines, is driven by lithographic performance.

IC fabrication techniques often utilize a photomask (also referred to as a mask) or a reticle. Radiation is provided selectively through or reflected off the mask or reticle to form an image on a semiconductor wafer. Generally, the image is projected and patterned onto a layer of material, such as, photoresist material, on the wafer. In turn, the patterned photoresist material is utilized to define doping regions, deposition regions, etching regions, and/or other structures of the IC. The patterned photoresist material can also define conductive lines or conductive pads associated with metal layers of the IC. Further, the patterned photoresist material can define isolation regions, transistor gates, or other device structures and elements.

To transfer an image or pattern onto the photoresist material, lithography systems include a light source configured to provide electromagnetic radiation or light at one or more wavelengths. The light source may produce radiation at a wavelength of 365 nanometers (nm), 248 nm, and/or 193 nm. The photoresist material patterned by such radiation is selected to be responsive to the wavelength of such radiation. Preferably, the areas of the photoresist material upon which radiation is incident undergo a photochemical change such that it becomes suitably soluble or insoluble in a subsequent developing step.

As IC device dimensions continue to shrink, it becomes necessary to define dimensions that are smaller than what is possible using conventional lithographic techniques. One process for achieving sub-lithographic device dimensions is by reducing or "trimming" features defined on the patterned photoresist material before such features are patterned onto the underlying layer(s). This process, commonly referred to as a resist trim or trimming process, utilizes a plasma etch to remove some of the patterned photoresist material such that the lateral dimensions of the trimmed features will be smaller than the original lithographically patterned features (i.e., before the trimming process).

In a resist trimming process, the plasma bombards all surfaces of the patterned photoresist material, such that top surface as well as side or lateral surfaces of the patterned photoresist material are ashed. Hence, as the trimming time is increased (i.e., the patterned photoresist material is exposed to the plasma etch for a longer period of time) in order to further reduce lateral dimensions (i.e., further ash the side surfaces, thereby reducing the width of features, such as, contact lines), the thickness of the patterned photoresist material is also being reduced (due to erosion of its top surface). Unfortunately, with enough thinning of the patterned photoresist material, there may not be enough photoresist thickness remaining to survive or with which to perform subsequent processes, such as pattern transfer to underlying layer(s) via an etch process.

Moreover, in some cases, the plasma has a tendency to bombard the top surface of the patterned photoresist material more than the lateral surfaces. As such, in an aggressive trimming process with a layer of photoresist material having a starting thickness of 300 nm, by the time approximately 50 nm has been trimmed from all sides of a given feature, in other words, achieving a 100 nm lateral reduction, close to 100 nm of vertical thickness may also be lost. This amount of thinning of the photoresist material is likely to result in pattern destruction during subsequent processes.

To combat the photoresist thinning problem, thicker layers of photoresist material have been considered to combat resist thinning that occurs during the trimming process. However, thicker layers of photoresist material are susceptible to pattern deformation and/or incomplete pattern transfer on the photoresist material become issues. Because the resolution of features is, in part, proportional to the inverse of the exposure or lithographic wavelength, it is desirable to pattern photoresist material using shorter exposure wavelengths (e.g., 157 nm, 126 nm, or 13.4 nm). Presently, no photoresist materials exist that are specifically suited for such shorter exposure wavelengths. Hence, photoresist materials conventionally used in 265 nm, 248 nm, or 193 nm lithography are utilized, even for the shorter exposure wavelengths.

The longer wavelength photoresist materials exhibit high optical absorption per unit thickness at the shorter exposure wavelengths. The longer wavelength photoresist materials are increasingly opaque to shorter wavelength radiation and the necessary photochemical change does not occur throughout the entire thickness of the material. As the photoresist material thickness is increased, incomplete pattern transfer throughout the entire thickness of the material is even more likely to occur.

Alternatively, even if complete pattern transfer has occurred, prolonged trimming (to achieve very narrow features in the thicker patterned photoresist material) can cause pattern deformation, such as, pattern collapse, pattern bending, or pattern breakage. The probability of pattern deformation of a given feature increases as its aspect ratio (i.e., the ratio of the height vs. the width of the feature), increases. Thus, a thicker photoresist material is more likely to result in pattern deformation.

Using a conventional thickness of photoresist material places a limit on lateral trimming due to vertical consumption concerns. Namely, since the ashing process also thins the photoresist as it narrows the patterned features, the trimming process must be stopped before desirable lateral reduction has been achieved to ensure that a thick enough layer of patterned photoresist material remains for subsequent processes (e.g., etch processes for pattern transfer to underlying layer(s), such as a polysilicon gate formation). On the other hand, starting with a thicker layer of photoresist material to permit prolonged trimming is also problematic due to incomplete pattern transfer and/or pattern deformation concerns.

Thus, there is a need for a process for permitting a conventional photoresist trimming process to be utilized to its maximum potential. There is a further need for a process for laterally trimming patterned features on a photoresist material without such photoresist material having associated therewith pattern deformation, incomplete pattern transfer, or insufficient vertical thickness for subsequent lithographic processes. Even further still, there is a need for a process for forming sub-lithographic photoresist features without extensive modification to conventional lithographic techniques, tools, materials, or equipment or significantly decreasing throughput.

BRIEF SUMMARY OF THE INVENTION

One exemplary embodiment relates to a method of trimming a feature patterned on a photoresist layer. The photoresist layer is disposed over a substrate and the feature includes a top portion and lateral surfaces. The method includes modifying the top portion of the feature patterned on the photoresist layer in an ion-dominated environment to form a modified top portion. The method further includes trimming the feature patterned on the photoresist layer to form a trimmed feature. A vertical trim rate and a lateral trim rate are associated with the feature. The vertical trim rate is slower than the lateral trim rate due to the modified top portion.

Another exemplary embodiment relates to an integrated circuit fabrication process. The process includes developing a patterned photoresist layer, and modifying the patterned photoresist layer to form a top portion and a bottom portion of the at least one feature. The patterned photoresist layer includes at least one feature. The top portion has a top etch rate and the bottom portion has a bottom etch rate. The top etch rate is different from the bottom etch rate. The process further includes trimming the patterned photoresist layer to change the at least one feature to have a sub-lithographic lateral dimension and a sufficient vertical thickness to maintain pattern integrity. The modifying step is performed after the developing step and before the ashing step.

Still another exemplary embodiment relates to an integrated circuit having a feature of sub-lithographic dimension. The feature is formed by the process including patterning the feature on a photoresist layer disposed over a substrate, developing the feature patterned on the photoresist layer, and changing at least a portion of the photoresist layer. The feature is patterned in accordance with a radiation at a lithographic wavelength and a pattern provided on a mask or a reticle. A top portion of the feature patterned on the photoresist layer is changed to have a different etch rate from a bottom portion of the feature patterned on the photoresist layer. The process further includes trimming the feature patterned on the photoresist layer to a sub-lithographic dimension, and transferring the trimmed feature patterned on the photoresist layer to the substrate. The feature in the substrate has the sub-lithographic dimension.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
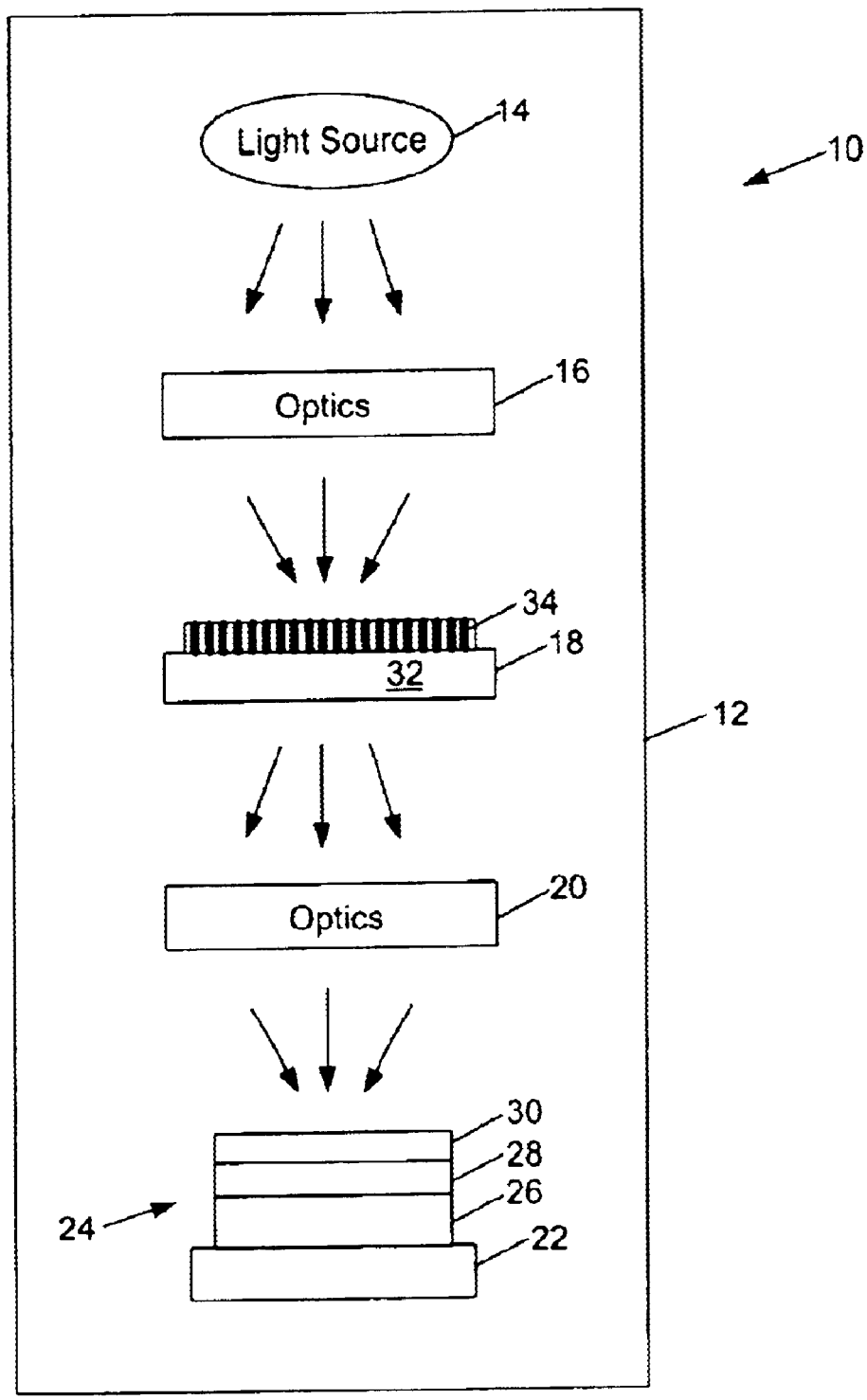
FIG. 1 is a general schematic block diagram of a lithographic system for patterning a wafer in accordance with an exemplary embodiment.

Referring to FIG. 1, a wafer 24 is disposed in a lithographic system 10. Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to wafer 24. Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 24 includes a substrate 26, a layer 28, and a photoresist layer 30. Photoresist layer 24 is disposed over layer 28, and layer 28 is disposed over substrate 26. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Layer 28 can be an insulative layer, a conductive layer, a barrier layer, or other layer of material to be etched, doped, or layered. In one embodiment, layer 28 can comprise one or more layers of materials, such as, a gate stack comprised of a gate dielectric covered by polysilicon, a silicide such as tungsten silicide, or other conductive materials. In another embodiment, layer 28 is a hard mask layer, such as, a silicon nitride layer or a metal layer. The hard mask layer can serve as a patterned layer for processing substrate 26 or for processing a layer upon substrate 26. In yet another embodiment, layer 28 is an anti-reflective coating (ARC). Substrate 26 and layer 28 are not described in a limiting fashion, and can each comprise a conductive, semiconductive, or insulative material.

Photoresist layer 30 can comprise a variety of photoresist chemicals suitable for lithographic applications. Photoresist layer 30 is selected to have photochemical reactions in response to electromagnetic radiation emitted from light source 14. Materials comprising photoresist layer 30 can include, among others, a matrix material or resin, a sensitizer or inhibitor, and a solvent. Photoresist layer 30 is preferably a chemically amplified, positive or negative tone, organic based photoresist. For example, photoresist layer 30 may comprise PAR700 photoresist manufactured by Sumitomo Chemical Company. Photoresist layer 30 is deposited, for example, by spin-coating over layer 28. Photoresist layer 30 is provided at a thickness of less than 1.0 µm.

Chamber 12 of lithographic system 10 can be a vacuum or low pressure chamber for use in vacuum ultraviolet (VUV) lithography. Chamber 12 can contain any of numerous types of atmospheres, such as, nitrogen, etc. Alternatively, lithographic system 10 can be utilized in various other types of lithography including lithography that uses electromagnetic radiation at any number of wavelengths.

Light source 14 provides light or electromagnetic radiation through condenser lens assembly 16, mask or reticle 18, and objective lens assembly 20 to photoresist layer 30. Light source 14 is an excimer laser, in one embodiment, having a wavelength of 365 nm, 248 nm, 193 nm, or 157 nm. Alternatively, light source 14 may be a variety of other light sources capable of emitting radiation having a wavelength in the ultraviolet (UV), vacuum ultraviolet (VUV), deep ultraviolet (DUV), or extreme ultraviolet (EUV) range.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

Mask or reticle 18 is a binary mask in one embodiment. Mask or reticle 18 includes a translucent substrate 32 (e.g., glass or quartz) and an opaque or patterned layer 34 (e.g., chromium or chromium oxide) thereon. Opaque layer 34 provides a pattern or image associated with a desired circuit pattern, features, or devices to be projected onto photoresist layer 30. Alternatively, mask or reticle 18 may be an attenuating phase shift mask, an alternating phase shift mask, or other type of mask or reticle.

Figure 2:
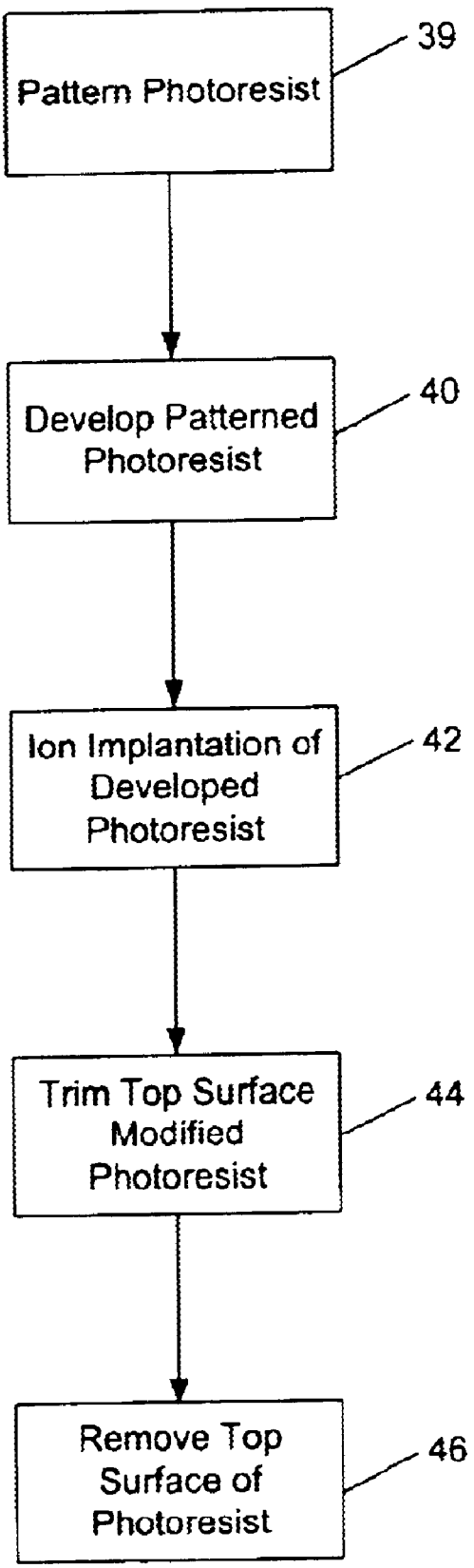
FIG. 2 is a flow diagram showing a process for forming sub-lithographic features in accordance with an exemplary embodiment.

An exemplary embodiment of the invention will be described with reference to a flow diagram shown in FIG. 2. The flow diagram includes a pattern photoresist step 39, a develop patterned photoresist step 40, an ion implantation step 42, a resist trimming step 44, and a remove top surface of photoresist step 46.

Figure 3:
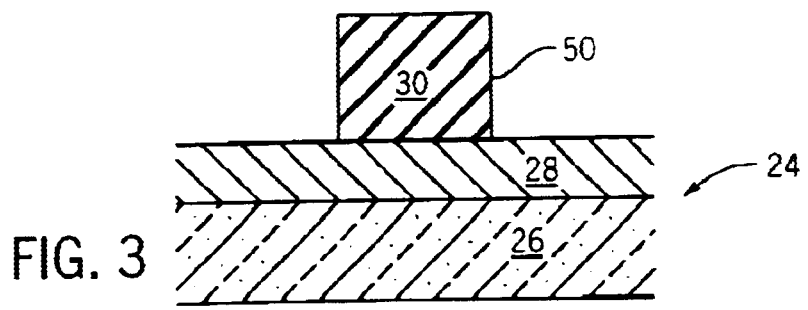
FIG. 3 is a cross-sectional view of the wafer, showing a development step.

Utilizing lithography system 10, the pattern or image provided on mask or reticle 18 is patterned on photoresist layer 30 in the pattern photoresist step 39. Next in step 40, wafer 24, including patterned photoresist layer 30, undergoes development to define features, such as, a feature 50, on photoresist layer 30 (FIG. 3).

After the patterned photoresist layer 30 has been developed but before such a pattern is transferred onto any of the underlying layers, such as, layer 28, an ion implantation step 42 is performed on wafer 24. It should be understood that wafer 24 may be removed from chamber 12 and placed within a different chamber and/or a different environment which provides ion implantation tools, such as, the Applied Materials, Inc. SWIFT implanter, or in a plasma processing tool, such as, the Lam Research Corp. TCP 9400 SE. Alternatively, chamber 12 may be configured to include additional chambers and/or tools suitable to perform step 42.

Figure 4:
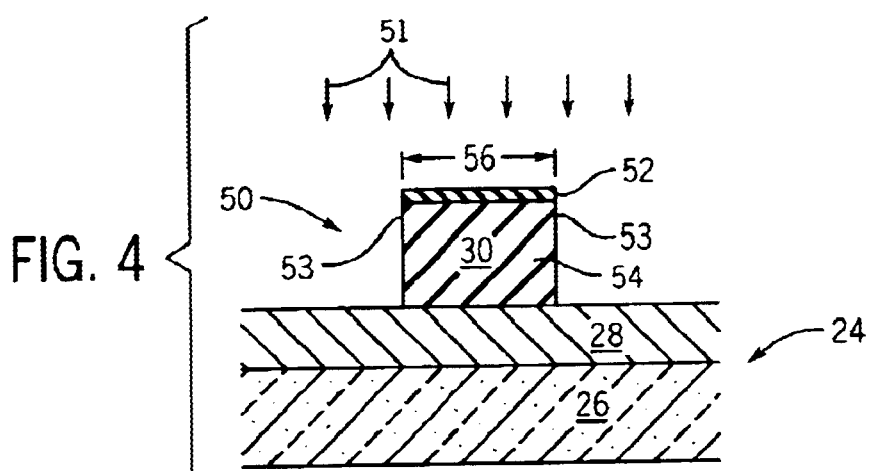
FIG. 4 is a cross-sectional view of the wafer illustrated in FIG. 3, showing an ion implantation step.

Referring to FIG. 4, there is shown a cross-sectional view of a portion of wafer 24 undergoing ion implantation step 42. An uniform beam of ions 51 bombards wafer 24 to modify the exposed horizontal surface(s) of photoresist layer 30. For feature 50, this means that a top surface 52 is modified relative to an untreated portion 54 disposed below top surface 52. Ions 51 which come into contact with the molecules of layer 30 cause such molecules (e.g., top surface 52) to become chemically and structurally different from the non-bombarded regions (e.g., remaining portion 54). Ions 51 may include inert elements such as argon or nitrogen, or reactive compounds involving, for instance, fluorine in the form of $CF_4$. The dose of ions 51 may be in the range of approximately $1 \times 10^{12}$ to $1 \times 10^{16}$ ions/$cm^2$ with an energy approximately ranging from 0.1 to 20 keV.

Preferably, top surface 52 becomes harder or densifies such that it will have a slower trim or ash rate than the untreated areas of photoresist layer 30 (e.g., untreated portion 54). For instance, fluorinating wafer 24 can reduce the etch rate by hardening it, i.e., by reducing the reactivity of certain portions of layer 30 with trimming chemistries such as $O_2$. In one embodiment, top surface 52 has a reduced ash rate in the range of 10–75% slower than the ash rate of untreated portion 54. Top surface or hardened layer 52 has a thickness in the range of 5–200 nm.

Wafer 24 is exposed to an ion-dominated environment such as an argon, fluorine, or $CF_4$ containing plasma. Ions 51 generated in this ion-dominated environment are configured to be perpendicularly directed with respect to the horizontal surface of layer 30 (in other words, ions 51 should come down onto layer 30 as vertically as possible) such that ions 51 do not harden the exposed side or lateral surfaces of layer 30 (e.g., side walls 53 of feature 50).

The vertical thickness or depth of top surface 52 is primarily determined by the depth of penetration of ions 51. The depth of ion penetration can be determined experimentally or by using a Monte Carlo modeling program. The depth of ion penetration depends on the ion species, the properties of the photoresist, and the ion energy. Typically, the higher the ion energy the greater the depth of ion penetration (e.g., greater the depth of top surface 52). For example, Lam Research Corp. TCP 9400SE operated at a chamber pressure of 20 mTorr, a bias power of 1000 W, and flowing 100 sccm Ar will supply ions 51 (in this instance, ions 51 being Ar+ions) in the 1.0 keV range to layer 30 to a depth of about 50 nm.

The reduced trim rate of top surface 52, relative to the trim ratio of untreated region 54, is primarily determined by the ion dose, with higher doses causing further reduction in the trim rate. The trim rate of top surface 52 is also dependent on reactions between the ion species being implanted or penetrating into layer 30 and the material comprising layer 30. Depending on the extent of trimming desired, the vertical thickness and/or hardness of top surface 52 can be controlled by the configuration of ions 51 such that all of top surface 52 will not be removed before the desired critical dimension has been achieved (i.e., before the completion of the trimming step 44).

After step 42, feature 50 is suitably configured to withstand a more aggressive resist trimming or ashing process than is conventionally possible. Treated top surface 52 has greater etch resistance (or, equivalently, a slower etch or ash rate) than untreated region 54. Hence, in trimming step 44 following ion implantation step 42, a desired amount of lateral trimming of features, such as feature 50, can occur without sustaining adverse photoresist thickness loss.

Figure 5:
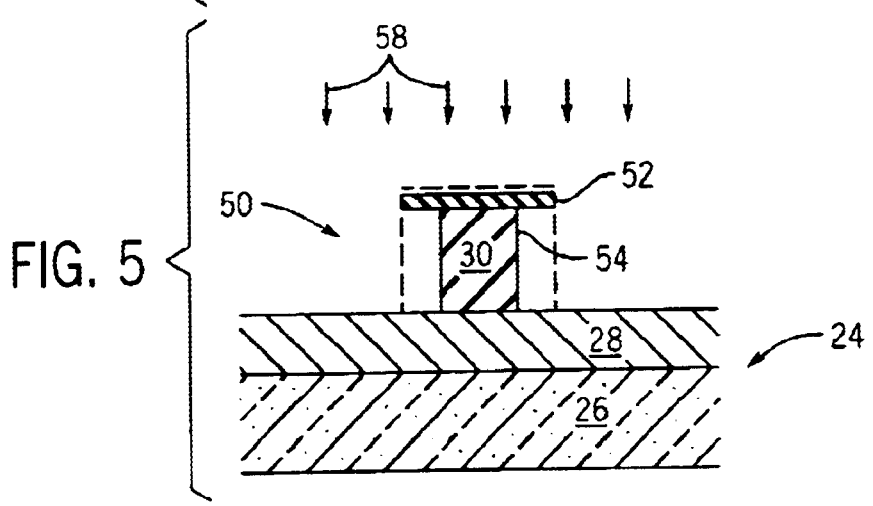
FIG. 5 is a cross-sectional view of the wafer illustrated in FIG. 4, showing a resist trimming step.

With reference to FIG. 5, feature 50 comprising top surface 52 and untreated portion 54 undergoes the resist trimming or ashing process (i.e., step 44). Wafer 24 is preferably exposed to a plasma etchant 58 to trim or reduce the dimensions of features patterned on layer 30. Plasma etchant 58 can comprise a variety of plasma etch chemistries, such as, oxidizing chemistries involving oxygen ($O_2$, CO, or $H_2O_2$) or reducing chemistries involving hydrogen ($H_2$ or $NH_3$). These gases can be used either in their pure form, mixed with each other, or combined with other gases, such as, Ar, $N_2$, He, and/or $H_2$. For example, with a Tokyo Electron, Ltd. Unity II DRM plasma etching system, plasma etchant 58 can have the following parameters associated therewith: 200 mTorr chamber pressure, 200 W RF power, 200 sccm $N_2$, 20 sccm $O_2$, and 25° C. lower electrode temperature. Under these conditions, the trimming rate is approximately 1.4 nm/sec such that about 36 seconds of trimming time is required to achieve a 50 nm critical dimension reduction. Wafer 24 may be in the same processing environment (e.g., same chamber) for both steps 42 and 44, or may be removed from the processing environment of step 42 and placed in a different processing environment for step 44.

Plasma etchant 58 etches all exposed surfaces on layer 30, including the top and side surfaces. However, because different portions of layer 30 have different etch rates following ion implantation step 42 (e.g., top surface 52 vs. untreated portion 54), the dimensional reduction of all of the surfaces of layer 30 will not be the same. As shown in FIG. 5, the vertical reduction of feature 50 is less than the lateral reduction of feature 50. Specifically, top surface 52 trims vertically at a slower rate than the sides of untreated portion 54, temporarily making feature 50 a "T" shaped feature. The dotted line in FIG. 5 represents the shape of feature 50 before commencement of resist trimming step 44.

Preferably, top surface 52 and plasma etchant 58 are configured such that the amount of consumption or erosion of top surface 52 during step 44 is small or negligible. The vertical thickness loss associated with top surface 52 is 10–75% less than without hardening. So a 50 nm critical dimension reduction, corresponding to 25 nm removal from each side of untreated region 54, removes approximately 6.25–22.5 nm from top surface 52. In contrast, the exposed surfaces of untreated portion 54 (i.e., side walls 53) will trim to sub-lithographic dimensions. Top surface 52 has a slower etch rate than untreated regions 54 as top surface 52 contains a smaller number of holes or pores per unit area into which plasma etchant 58 can penetrate and break apart.

Figure 6:
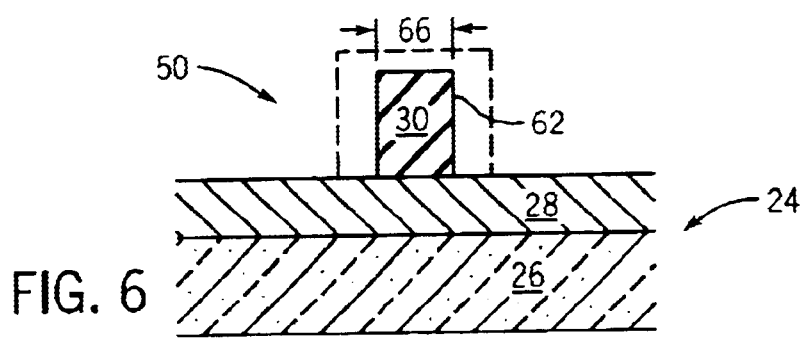
FIG. 6 is a cross-sectional view of the wafer illustrated in FIG. 5, showing a removal step.

After trimming step 44 has been completed, the remaining top surface 52 can be removed by an energetic oxidizing or reducing process in step 46. As shown in FIG. 6, feature 50 now comprises untreated portion 54 which has been laterally trimmed (i.e., a trimmed portion 62). Trimmed portion 62 has a lateral dimension 66 that is smaller than an initial or nominal lateral dimension 56 (FIG. 4) of feature 50. In one embodiment, initial lateral dimension 56 may be 150 nm and lateral dimension 66 may be in the range of 30–120 nm. The vertical thickness of trimmed feature 50 is the vertical thickness of trimmed portion 62, and may be about 50–90% of the original vertical thickness of feature 50 (i.e., before resist trimming step 44).

Trimmed feature 50 of FIG. 6 may then be transferred to other layers comprising wafer 24, such as, layer 28, via an etching process (not shown). Accordingly, wafer 24 will contain integrated circuit features having sub-lithographic dimensions. Trimmed feature 50 may define features, such as, but not limited to, a conducting line, a gate of an MOS transistor, or a dielectric space, for example, between adjacent conductor trenches in a damascene application. In one embodiment, the removal of the remaining top surface 52 after the resist trimming step and pattern transfer to underlying layer(s) may be accomplished in a single process step.

Conventionally, for 193 nm lithographically patterned features without the ion bombardment treatment, features having a nominal lateral dimension of about 150 nm cannot be trimmed to less than about 110 nm without the features disintegrating during subsequent processes, such as an etch process, (i.e., due to insufficient thickness of the remaining layer 30). In contrast, by modifying the top surface of layer 30 to slow the vertical resist thickness loss during the resist trimming step, the resultant features patterned on layer 30 can achieve trimmed lateral dimensions similar to those achievable with conventional resist trimming processes but with more resist thickness remaining. Alternatively, the resultant features patterned on layer 30 can comprise a resist thickness similar to those conventionally achievable but with narrower lateral dimensions. Having a greater thickness of resist remaining increases the probability that such trimmed features will survive subsequent processes to be faithfully patterned onto underlying layers.

In this manner, conventional photoresist materials, conventional photoresist thicknesses, and/or conventional resist trimming processes may be utilized to form integrated circuit (IC) features having significantly sub-lithographic dimensions without concerns of pattern deformation or destruction during pattern transfer to underlying layer(s). Moreover, a more aggressive resist trimming process is permitted (e.g., extended trimming time) before destruction of pattern integrity is likely to occur due to insufficient resist thickness.

It is understood that while the preferred embodiment and specific examples are given, they are for the purpose of illustration only and are not limited to the precise details described herein. For example, although particular materials or chemistries are described, other materials or chemistries can be utilized. Various modifications may be made in the details within the scope and range of the equivalence of the claims without departing from what is claimed.

What is claimed is:

1. A method of trimming a feature patterned on a photoresist layer, the photoresist layer disposed over a substrate and the feature including a top portion and lateral surfaces, the method comprising the steps of:

modifying the top portion of the feature patterned on the photoresist layer in an ion-dominated environment to form a modified top portion by flood exposing the feature to ions or by fluorinating the top portion to undergo a reduction in reactivity; and trimming the feature patterned on the photoresist layer to form a trimmed feature, wherein a vertical trim rate and a lateral trim rate are associated with the feature and the vertical trim rate is slower than the lateral trim rate due to the modified top portion.

2. The method of claim 1, wherein the modifying step includes flood exposing the feature to ions.

3. The method of claim 2, wherein the modifying step includes bombarding or fluorinating the top portion with the ions for the top portion to undergo a reduction in reactivity.

4. The method of claim 2, wherein the vertical trim rate is a function of at least one of a dose of the ions and a species of the ions.

5. The method of claim 2, wherein a vertical thickness of the modified top portion is a function of at least one of an energy of the ions and a mass of the ions.

6. The method of claim 1, wherein the trimmed feature has a sub-lithographic lateral dimension.

7. The method of claim 1, wherein the trimming step includes plasma etching the feature.

8. The method of claim 1, further comprising removing the modified top portion after the trimming step.

9. An integrated circuit fabrication process, the process comprising:

developing a patterned photoresist layer, the patterned photoresist layer including at least one feature;

modifying the patterned photoresist layer to form a top portion and a bottom portion of the at least one feature, the top portion having a top etch rate and the bottom portion having a bottom etch rate, wherein the top etch rate is different from the bottom etch rate; and trimming the patterned photoresist layer by plasma etching to change the at least one feature to have a sub-lithographic lateral dimension, whereby a sufficient vertical thickness exists to maintain pattern integrity, wherein the modifying step is performed after the developing step and before the trimming step.

10. The process of claim 9, wherein modifying the patterned photoresist layer includes hardening the top portion.

11. The process of claim 10, wherein modifying the patterned photoresist layer includes flood exposing the patterned photoresist layer to a beam of ions.

12. The process of claim 11, wherein trimming the patterned photoresist layer includes minimally consuming the top portion and laterally etching the bottom portion.

13. The process of claim 12, wherein a majority of the top portion and a laterally trimmed bottom portion comprises the at least one feature upon completion of the modifying step, the laterally trimmed bottom portion having the sub-lithographic lateral dimension and the sufficient vertical thickness to maintain pattern integrity.

14. The process of claim 13, further comprising removing the majority of the top portion after the modifying step to form a trimmed feature.

15. The process of claim 12, further comprising selecting parameters associated with the beam of ions to configure at least one of a thickness and the top etch rate of the top portion.

16. A process of forming an integrated circuit having a feature of sub-lithographic dimension, the process comprising steps of:

patterning the feature on a photoresist layer disposed over a substrate, the feature patterned in accordance with a radiation at a lithographic wavelength and a pattern provided on a mask or a reticle;

developing the feature patterned on the photoresist layer;

changing at least a portion of the photoresist layer, wherein a top portion of the feature patterned on the photoresist layer is changed to have a different etch rate from a bottom portion of the feature patterned on the photoresist layer;

trimming the feature patterned on the photoresist layer to a sub-lithographic dimension wherein the trimming does not entirely remove the top portion;

removing the top portion from the feature; and transferring the trimmed feature patterned on the photoresist layer to the substrate, wherein the feature in the substrate has the sub-lithographic dimension.

17. The process of claim 16, wherein the changing step includes ion implanting the photoresist layer to form the top portion.

18. The process of claim 17, wherein the top portion is removed in a separate reducing or oxidizing step.

19. The process of claim 18, wherein the top portion has an etch rate 15–70% slower than an untreated etch rate of the photoresist layer during the trimming step.

20. The process of claim 17, wherein the ion implantation comprises implanting at least one of Ar+, F+, and Kr+ ions.

21. The process of claim 20, wherein parameters associated with the ion implantation are Ar ions at an energy of approximately 1 keV and a dose of approximately $1\times10^{13}$ ions/cm$^2$.

22. The process of claim 16, further comprising removing the top portion after the trimming step and before the transferring step.

23. The process of claim 16, wherein the lithographic wavelength of the radiation is 193 nm and the sub-lithographic dimension of the feature is approximately 150 nm.

24. The process of claim 16, wherein the sub-lithographic dimension of the feature is in the range of 30–120 nm smaller than the feature developed on the photoresist layer.

* * * * *